United States Patent [19]

Ohta

[11] Patent Number: 4,706,262
[45] Date of Patent: Nov. 10, 1987

[54] FSK OR FM BURST SIGNAL GENERATING APPARATUS

[75] Inventor: Kiyoshi Ohta, Tokyo, Japan

[73] Assignee: NEC Corporation, Tokyo, Japan

[21] Appl. No.: 716,270

[22] Filed: Mar. 26, 1985

[30] Foreign Application Priority Data

| Mar. 30, 1984 [JP] | Japan | 59-62805 |
|---|---|---|
| Apr. 12, 1984 [JP] | Japan | 59-73811 |
| Feb. 6, 1985 [JP] | Japan | 59-21445 |

[51] Int. Cl.⁴ .................................... H04L 25/49
[52] U.S. Cl. ....................................... 375/60; 375/68; 332/37 D; 455/116; 455/126
[58] Field of Search ................ 375/42, 60, 71, 72, 375/73, 68; 455/126, 118, 116; 332/37 D, 9 R; 328/63

[56] References Cited

U.S. PATENT DOCUMENTS

| 2,808,569 | 10/1957 | Morrison | 332/37 D |
|---|---|---|---|
| 3,649,918 | 3/1972 | Freedman et al. | 375/73 |
| 3,662,290 | 5/1972 | Elliott | 455/126 |
| 3,667,049 | 5/1972 | Ostroff et al. | 375/71 |
| 4,090,138 | 5/1978 | Voorman et al. | 375/42 |
| 4,485,478 | 11/1984 | Takada | 375/60 |

*Primary Examiner*—Benedict V. Safourek
*Assistant Examiner*—M. Huseman
*Attorney, Agent, or Firm*—Sughrue, Mion, Zinn, Macpeak, and Seas

[57] ABSTRACT

A burst signal generating apparatus and related method includes a modulator circuit for modulating a carrier wave of an intermediate frequency signal with a modulating signal. The output of the modulator having a carrier wave frequency is converted to a radio frequency which is amplitude controlled in response to a burst control signal. The carrier wave of the intermediate frequency is switched in response to a burst control signal. Thus, a carrier wave of the radio frequency signal has a desired envelope, permitting ready suppression of the carrier wave during pauses between burst signals.

14 Claims, 16 Drawing Figures

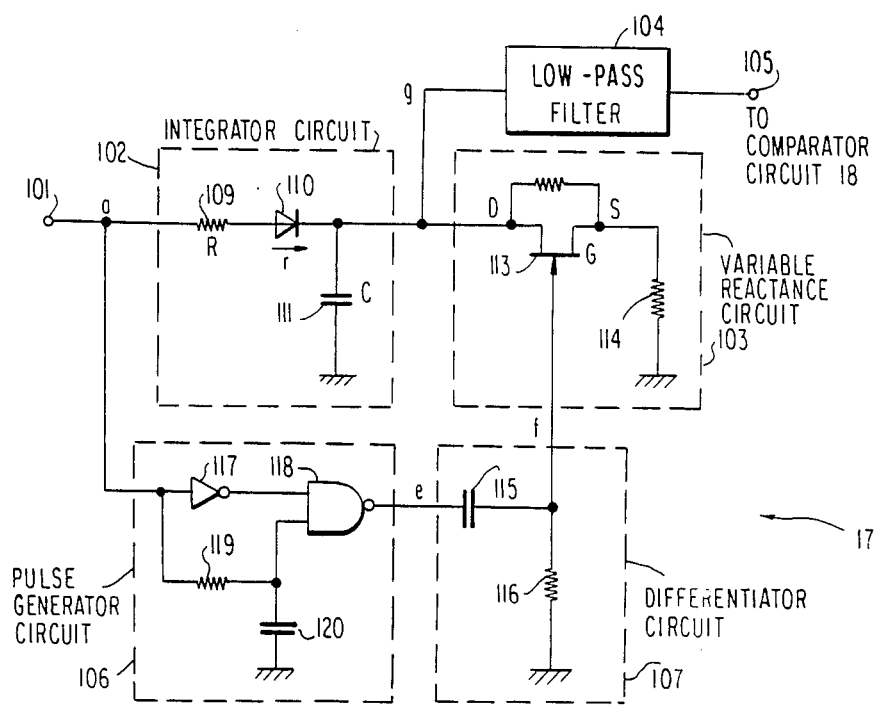
FIG. 5
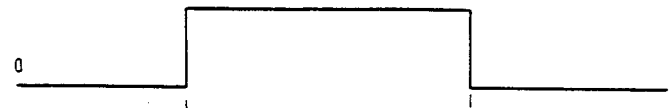
FIG. 6A  a
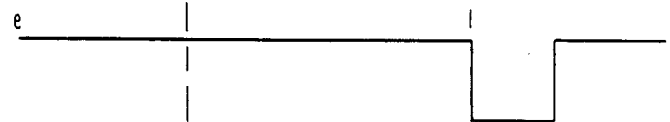
FIG. 6B  e
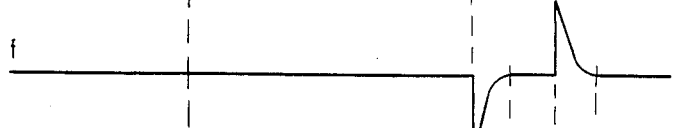
FIG. 6C  f
FIG. 6D  g

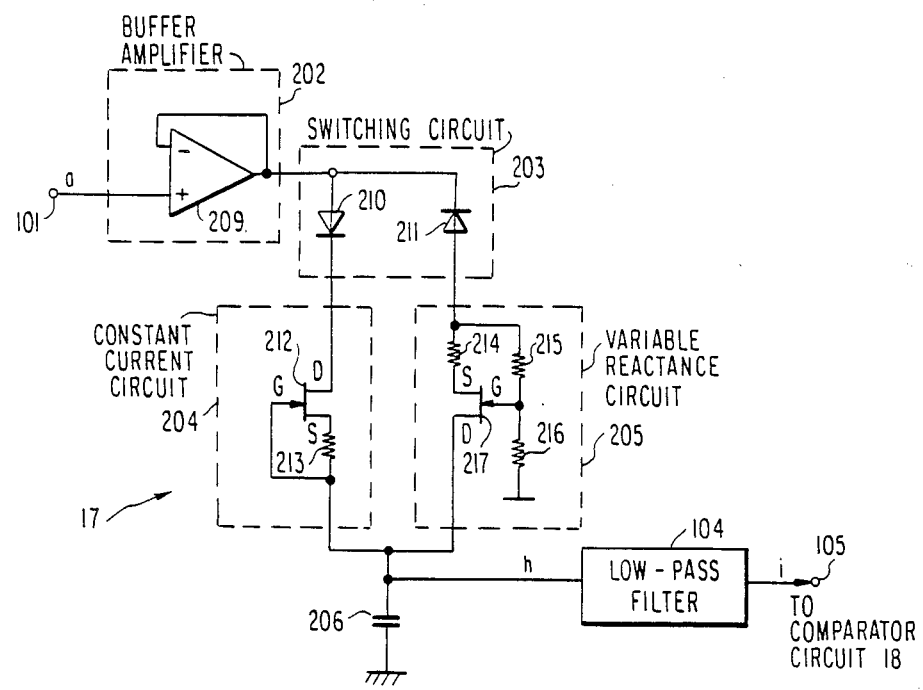
FIG.7
FIG.8A  a
FIG.8B  h
FIG.8C  i

FSK OR FM BURST SIGNAL GENERATING APPARATUS

BACKGROUND OF THE INVENTION

The present invention relates to a burst signal generating apparatus for use in a time division multiple access (TDMA) communication system and, more particularly, to an apparatus for generating FSK (frequency shift keying) or FM (frequency modulation) burst signals.

FSK or FM burst signal generating apparatuses proposed to date include the "Burst Signal Transmission System" by K. Watanabe, which is the subject matter of the published unexamined Japanese patent application No. 99851/84, assigned to the present applicant; corresponding to which is the U.S. patent application Ser. No. 555,926 filed Nov. 29, 1983, now U.S. Pat. No. 4,592,073. The system proposed by Watanabe includes an FSK or FM modulator and a high power (HP) amplifier comprising a preamplifier and a non-linear power amplifier (Class C amplifier) which are sequentially connected. To expand the dynamic range of the HP amplifier, the preamplifier is prebiased. This permits an FSK or FM burst signal to have gently sloped leading and trailing edges. However, this prebiasing invites leaking of the carrier wave from the modulator to the output of HP amplifier, even during the pauses of burst signals. Therefore, sufficient isolation has to be achieved by a control circuit consisting of an attenuator, which is provided between the modulator and the HP amplifier.

Sufficient suppression of the carrier wave in a control circuit, especially of a carrier wave in the UHF band or an even higher frequency region, is achieved by cascade connection of a plurality of PIN diodes. This connecting structure invites an increase in insertion loss, and has disadvantages in power efficiency and cost.

Furthermore, the reference waveform (burst envelope waveform) generator circuit included in the system proposed by Watanabe is a digital circuit, which successively reads data out of a read-only memory (ROM) by clock pulses and, after converting them into analog signals with a digital/analog converter, filters the converted data to generate the intended envelope. Such a digital envelope generator circuit, since it is generally required to operate at high speed, consumes much power and, as it also needs such peripheral circuits as a latching circuit and a digital/analog converter, requires a large packaging space, resulting in a bulky configuration.

SUMMARY OF THE INVENTION

An object of the present invention, therefore, is to provide a burst signal generating apparatus whose carrier wave has a certain envelope, permitting ready suppression of the carrier wave during the pauses of burst signals.

Another object of the invention is to provide a burst signal generating apparatus with a reduced number of PIN diodes used in the high frequency region.

Still another object of the invention is to provide a burst signal generating apparatus using a class C amplifier, which is highly efficient, yet has wide dynamic ranges, and is virtually free of carrier wave leaks.

Yet another object of the invention is to provide a burst signal generating apparatus comprising an envelope generator circuit which consumes little power and is small in circuit dimensions.

According to the invention, there is provided a burst signal generating apparatus comprising: a modulator circuit for modulating a carrier wave of an intermediate frequency with a modulating signal; a frequency converter circuit for converting the output frequency of the modulator circuit into a radio frequency; an amplitude control unit responsive to a burst control signal for controlling the amplitude of the carrier wave of the radio frequency; and means responsive to the burst control signal for switching the carrier wave of the intermediate frequency.

BRIEF DESCRIPTION OF THE DRAWINGS

These and other objects, features and advantages of the present invention will become more apparent from the detailed description hereunder taken in conjunction with the accompaning drawings, wherein

FIG. 5 is a schematic circuit diagram illustrating a first preferred embodiment of the envelope generator circuit according to the invention;

FIGS. 6A to 6D are waveform diagrams for describing the circuit of FIG. 5;

FIG. 7 is a schematic circuit diagram illustrating a second preferred embodiment of the envelope generator circuit according to the invention; and FIGS. 8A to 8C are waveform diagrams for describing the apparatus of FIG. 7.

DETAILED DESCRIPTION OF THE PREFERRED EMBODIMENTS

Figure 1:
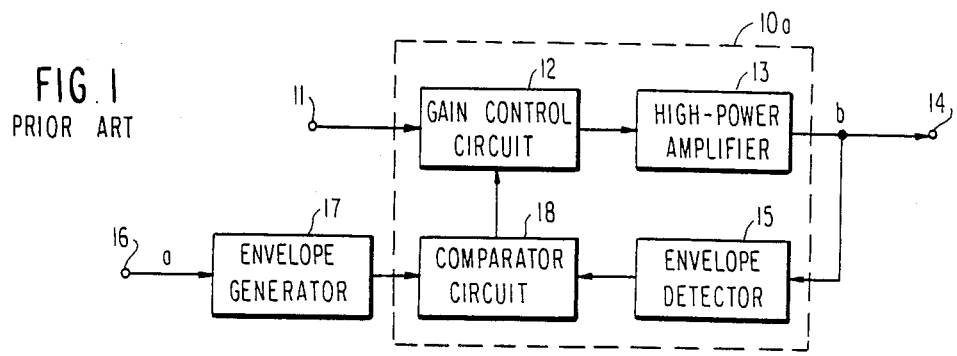
FIG. 1 is a schematic block diagram of a burst signal generating apparatus of the prior art.

Referring to FIG. 1 showing a conventional burst signal generating apparatus, a high frequency input signal fed to an input terminal 11 is supplied by way of a gain control circuit 12 to a high-power (HP) amplifier 13, where the signal is power-amplified and sent out to an output terminal 14. The HP amplifier 13 comprises a preamplifier and a non-linear amplifier (Class C amplifier). To expand a dynamic range of the HP amplifier 13, the preamplifier is prebiased. The amplified output b is detected by an envelope detector 15, and compared by a comparator circuit 18 with a reference waveform which is generated by an envelope generator circuit 7 in response to a control signal a fed to a terminal 16. From the comparison, the comparator circuit 18 provides an error signal, with which the amplification gain of the gain control circuit 12 is controlled. The gain control circuit 12, HP amplifier 13, envelope detector 15 and comparator circuit 18 constitute an amplitude control unit 10A.

Figure 2A:
FIGS. 2A and 2B are waveform diagrams for describing the apparatus of FIG. 1.
Figure 2B:
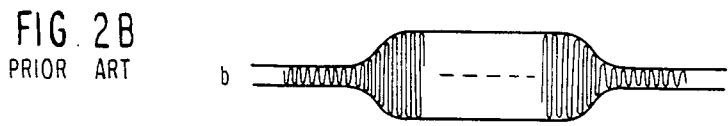

With the apparatus described above, with respect to the control signal as shown in FIG. 2A, the waveform of the output signal b is as shown in FIG. 2B. Thus, while the amplitude of the output signal b has gently sloped leading and trailing edges under the loop gain control of the amplitude control unit 10A, there are carrier leaks during the pauses of bursts, owing to the use of prebiased preamplifier in the HP amplifier 13. These leaks can be prevented by increasing the number of stages of PIN diodes in the gain control circuit 12, but it would give rise to the problems of insertion loss, power efficiency drop and cost rise as stated above.

Figure 3:
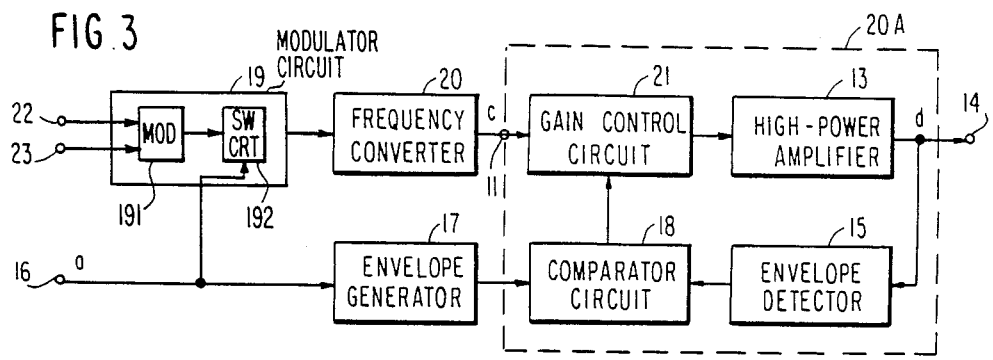
FIG. 3 is a schematic block diagram of a burst signal generating apparatus according to the invention.

Now, preferred embodiments of the invention will be described in detail. In FIG. 3, the same components as in FIG. 1 are represented by respectively the same numerals. An input terminal 11, to which high frequency signals are supplied, is connected to a gain control circuit 21, and a gain-controlled signal from the gain control circuit 21 is coupled to a power amplifier circuit 13, from which a burst signal d, amplified to a required transmission power, is coupled to an output terminal 14 and branched to be further coupled to an envelope detector 15, which detects the amplitudes of signal d. A control signal terminal 16, to which a burst control signal a is provided, is connected to an envelope generator circuit 17. A reference waveform signal, which serves as the reference for the envelope, from the envelope waveform generator circuit 17 and an envelope detection signal from the detector 15 are supplied to a comparator circuit 18, from which an error signal is supplied to the gain control circuit 21. The gain control circuit 21, HP amplifier 13, envelope detector 15 and comparator circuit 18 constitute an amplitude control unit 20A.

A feature of the present invention here resides in that the burst control signal a appearing at the control signal terminal 16 is supplied to a modulator circuit 19 as well as the envelope generator 17, and that a modulated output signal is switched on and off in synchronism with the burst control signal.

The modulating and switching are respectively done by a modulator 191 and a switching circuit 192 within the modulator cicuit 19. The modulator circuit 19 modulates an intermediate frequency (IF) carrier wave fed from an input terminal 22 with a modulating signal fed from another input terminal 23. The output signal thereby modulated is switched on and off by the switching circuit 192 and then converted into a radio frequency (RF) carrier wave by a frequency converter 20, whose output is supplied to the gain control circuit 21 via an input terminal 11. Thus in the apparatus according to the invention, switching is used in combination in the IF stage prior to frequency conversion. In this particular example, a diode switch circuit is provided in the path of the IF signal, and is opened and closed with the burst control signal.

Figure 4A:
FIGS. 4A to 4C are waveform diagrams for describing the apparatus of FIG. 3.
Figure 4B:
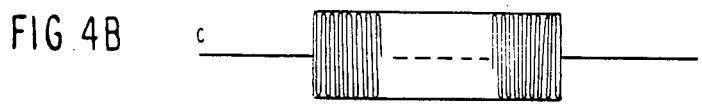
Figure 4C:
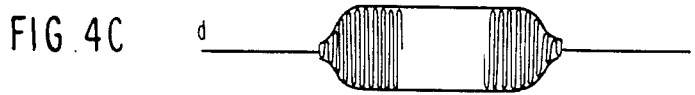

FIGS. 4A to 4C are waveform diagrams illustrating the operations of the embodiment shown in FIG. 3. Since the operation of the modulator circuit 19 is controlled in accordance with the control signal a fed from the terminal 16, carrier wave c at the input terminal 11 is an intermittent carrier wave as shown in FIG. 4B. Spectrum spread is prevented by easing the slopes of the leading and trailing edges of the carrier wave c by the loop gain control of the amplitude control unit 20A.

Generally the lower the frequency at which a switching circuit is used, the smaller the losses when the switching circuit is closed and the smaller the leaks when it is open. Thus, if a diode switch is to be composed for the radio frequency carrier wave as in the conventional embodiment illustrated in FIGS. 1 and 2, many diodes will have to be connected in series because there will be signal leaks attributable to the capacity between electrodes even when the circuit is open. In contrast, in order to achieve switching in a stage where the signal frequency is low as in the present embodiment, the leaks during the open phase of the circuit can be kept sufficiently small even if diodes of the same capacity between electrodes are used. Therefore, the number of required diodes is reduced (only one in this example), and their losses during the closed phase of the circuit can also be reduced. Because of the low frequency at which the switching circuit is used, the diodes need not be expensive, resulting in a significantly low cost of the switching circuit.

As herethereto described, by providing a modulator circuit which accomplishes switching in the intermediate frequenty region with a burst control signal, there is realized the remarkable advantage of simplifying, reducing the cost of and saving the power consumption of the circuit, wherein the carrier wave can be sufficiently suppressed during the pauses of bursts.

An unmodulated intermediate frequency carrier wave may be switched with the burst control signal a or the modulated intermediate frequency carrier wave, which is the output of the modulator, may be switched. The modulator circuit 19, which may be a phase-synchronized type modulator, should in this case desirably switch the modulated intermediate frequency carrier wave.

Next will be described in detail the envelope generator circuit 17. Referring to FIG. 5, the envelope generator circuit 17 includes an input terminal 101 for receiving the control signal a, an integrator circuit 102, a variable reactance circuit 103, a low-pass filter 104, an output terminal 105 coupled to the comparator circuit 18, a pulse generator circuit 106, and a differentiator circuit 107. The integrator circuit 102 comprises resistor 109, a diode 110 and capacitor 111. The pulse generator circuit 106 comprises an inverter 117, a NAND gate 118, a resistor 119 and a capacitor 120. The variable reactance circuit 103 is comprised of a high-resistance resistor 112, a field-effect transistor 113 and a low-resistance resistor 114, and the differentiator circuit 107 comprises a capacitor 115 and a resistor 116. These elements are connected as illustrated.

The operation of the envelope generator circuit 17 will now be described with reference to FIGS. 6A to 6D. The reactangular-shaped burst control signal a (FIG. 6A) from the input terminal 101 is supplied to the integrator circuit 102, in which the diode 110 is provided in such a direction that the charge of the capacitor 111 cannot be discharged to the input terminal 101. As the output of the integrator circuit 102, there is provided an integrated waveform with a gently sloped leading edge according to a time constant of $c(R+r)$, where R indicates the resistance of the resistor 109; r, the on-resistance of the diode 110 and c, the capacitance of the capacitor 111 (see the left part of FIG. 6D). Meanwhile as regards the waveform when the burst control signal a is off, as the diode 110 is reverse biased with respect to the signal a, the discharging time of the capacity 111 is determined by the variable reactance circuit 103 connected to the output side of the integrator circuit 102. Therefore, as shown in the right-hand side of FIG. 6D, the discharging time of the charge accumulated in the capacitor 111 is controlled by the variable reactance circuit 103, so that the inclination of the envelope can be set as desired. Further, this output waveform g is shaped by the low-pass filter 104 to give a burst envelope output which varies little on both the leading and trailing edges.

To describe its operation in further detail the depletion-type field effect transistor is connected, to the output of the integrator circuit 102 as illustrated. That is with its gate connected to one end of the differentiating resistor 116, its source to one end each of the low-resistance resistor 114 and the high-resistance resistor 112, and its drain to the other end of the high-resistance resistor 112, the output of the integrator circuit 102 and the input of the low-pass filter 104. Therefore, when the control signal a shown in FIG. 6A is supplied to the input terminal 101, at the output of the integrator circuit 102 is provided the output waveform g having a leading edge determined with a time constant of c(R+r). Meanwhile in the pulse generator circuit 106, a pulse e (FIG. 6B) of a certain width is generated at the trailing point of the burst control signal a. In addition, the differentiating circuit 107 generates a differentiated waveform f as shown in FIG. 6C, which is supplied to the gate of the field-effect transistor 113 as a control signal. As stated earlier, when the burst control signal a is off, the charge accumulated in the capacitor 111 is discharged through the channel of the field-effect transistor 113 because of the diode 110, but as shown in FIG. 6C, the gate of the field-effect transistor 113 in this period of time is deeply biased in the reverse direction and therefore is cut off. In this period t1, the charge is released by a time constant represented by τ1 through the high-resistance resistor 112 and the low-resistance resistor 114.

In a period of time t2 when the gate bias of the field-effect transistor 113 gradually decreases and then becomes zero V, the channel resistance of the transistor 113 becomes relatively small because the field-effect resistor 113 is of a depletion type. As a result the discharging effect is accelerated with a time constant of τ2 and the slope is made steeper. Further as the pulse f in the forward direction is supplied to the gate of the field-effect transistor 113 after the lapse of the period t1+t2 as shown in FIG. 6C, the channel resistance becomes smaller than the period of time t2, and the discharging is finished within a period t3 with a time constant of τ3, providing a control waveform g illustrated in FIG. 6D. This output waveform g is shaped by the low-pass filter 104 to become the output of the envelope generator circuit 17, and supplied to the comparator circuit 18 through the terminal 105.

Since this invention enables an envelope to be generated by a simple circuit with little power consumption as described above, it has the advantage of economizing hardware, compared with similar apparatuses of the prior art.

Now another preferred embodiment of the envelope generator circuit 17 will be described. Referring to FIG. 7, this envelope generator circuit 17 comprises an input terminal 101 for receiving the burst control signal a, a buffer amplifier 202, a switching circuit 203, a constant current circuit 204, a variable rectance circuit 205, a capacitor 206 and the low-pass filter 104. The buffer amplifier 202 comprises an operational amplifier 209. The the switching circuit 203 comprises a first diode 210 and a second diode 211. The anode of the first diode 210 and the cathode of the second diode 211 are connected to the output of the operational amplifier 209. The constant current circuit 204 is comprised of a first field-effect transistor 212 and a first resistor 213, which is connected between the source and the gate of the first field-effect transistor 212. The gate voltage of the first field-effect transistor 212 is supplied as the output of the constant current circuit 204. The variable reactance circuit 205 comprises a second resistor 214, a third resistor 215, a fourth resistor 216 and a second field-effect transistor 217, to whose source is connected the second resistor 214. To the gate of the second field-effect transistor 217 are connected the fourth resistor 216, the other end of which is connected to a common potential, and the third resistor 215, the other end of which is connected to the second resistor 214. The input terminal 101 is connected to the non-inverting input terminal of the operational amplifier 209. The output of the operational amplifier 209 is connected to the inverting input terminal as well as to the switching circuit 203. The cathode of the first diode 210 is connected to the constant current circuit 204, and the anode of the second diode 211, to one end of the variable reactance circuit 205. The output of the constant current circuit 204 and the other end of the variable reactance circuit 204 are connected to the capacitor 206, the other end of which is connected to the common potential. This connecting point is connected to the low-pass filter 104 and is further coupled the comparator circuit 18 through the terminal 105.

The rectangular-shaped burst signal a supplied to the input terminal 101 is coupled to the switching circuit 203 through the buffer amplifier 202 which is a voltage follower having a very high input impedance and very low output impedance. In the switching circuit 203, when the burst signal is at a high level, i.e., when a voltage "$V_H$" V is supplied from the converter circuit 202, the second diode 211 is biased in the reverse direction and turned off, but the first diode 210 is forwardly biased and conductive, so that a voltage is supplied to the constant current circuit 204. The constant current circuit 204, at the point of time when the voltage is supplied thereto, begins charging at a constant amperage. Therefore the voltages at the two ends of the capacitor 206 increase, linearly in terms of time, from "0" V to approximately "$V_H$" V (see FIG. 8B).

When the burst signal a is at a low level, i.e., when the output of the converter circuit 202 drops to "0" V, the first diode 210 is biased in the reverse direction and turned off. On the other hand, the second diode 211 becomes conductive, with the result that the charge accumulated in the capacitor 206 begins to be discharged in an exponential curve via the variable reactance circuit 205 and the second diode 211. Since the voltage at the two ends of the second diode 211 remain constant at "$V_F$" V, the voltage of the diode 211 is biased in the forward direction, if a suitable fixed bias is applied to the gate of the second field-effect transistor 217 from the anode of the second diode 211 by way of the third resistor 215 and the fourth resistor 216. A bias voltage which becomes shallower in an exponential curve will be supplied equivalently between the source and the gate of the second field-effect transistor 217. As a result, the discharging characteristic of the capacitor 206 becomes linear (see FIG. 8B).

Therefore, by taking the voltages at the two ends of the capacitor 206 as output, a burst waveform h having the desired slope can be provided from the rectangular burst signal a. This output waveform h is shaped by the low-filter circuit 104 into a burst envelope output i, gently sloped at both leading and trailing edges, which is supplied from the generator circuit to the comparator circuit 18 via the terminal 105.

Since this invention enables an envelope to be generated by a simple circuit with little power consumption as described above, it has the advantage of economizing the circuit, compared with similar circuits of the prior art.

What is claimed is:

1. A burst signal generating apparatus comprising:
   a modulator circuit for modulating a carrier wave of an intermediate frequency with a modulating signal;
   switching means responsive to a burst control signal for switching on and off the modulated carrier wave of said intermediate frequency;
   a frequency converter circuit for converting the output of said switching means into a radio frequency;
   an amplitude control unit including a prebiassed high-powered amplifier and responsive to said burst control signal for controlling the amplitude of the carrier wave of said radio frequency; and
   said amplitude control unit comprising said prebiassed high-power amplifier for power-amplifying the carrier wave of said radio frequency; an envelope detector circuit for branching the output of said prebiassed high-power amplifier and detecting the amplitude thereof; a comparator circuit for amplitude-comparing said burst control signal and the output of said envelope detector circuit to provide the resultant error signal: and a circuit responsive to said error signal for controlling the amplitude of the carrier wave of said radio frequency.

2. A burst signal generating apparatus, as claimed in claim 1, further comprising an envelope generator circuit for smoothening the leading and trailing edges of said burst control signal to be supplied to said comparator circuit.

3. A burst signal generating apparatus, as claimed in claim 2, wherein said envelope generator circuit comprises a pulse genertor circuit for generating pulses having a prescribed width after the trailing edge of said burst control signal; a differentiating circuit for differentiating the output of said pulse generator circuit; an integrating circuit for integrating said burst control signal in one direction; a variable reactance circuit responsive to the output voltage of said differentiating circuit for varying the resistance and thereby controlling the discharge time of the output of said integrating circuit; and a filter circuit connected between the output of said integrating circuit and the input of said variable reactance circuit for low-pass filtering the integrated output to generate the filtered output as the output of said envelope generator circuit.

4. A burst signal generating apparatus, as claimed in claim 3, wherein said integrating circuit comprises a resistor receiving said burst control signal at one end; a diode whose anode is connected to the other end of said resistor; and a capacitor connected between a cathode of said diode and ground, the connecting point between said cathode and said capacitor being made the output end of said integrating circuit. the filtered output as the output of said envelope generator circuit.

5. A burst signal generating apparatus, as claimed in claim 3, wherein said variable reactance circuit comprises a field-effect transistor having a gate receiving the output of said differentiating circuit, a drain receiving said integrated output and a source connected to one end of a first resistor; and a second resistor connected between said drain and source.

6. A burst signal generating apparatus, as claimed in claim 2, wherein said envelope generator circuit comprises a buffer amplifier receiving said burst control signal; a switching circuit having a first diode conductive in the direction of the output of said buffer amplifier and a second diode conductive in a direction reverse to the output of said buffer amplifier, one end each of those diodes being connected to the output end of said buffer amplifier; a constant current circuit connected to the other end of said first diode; a variable reactance circuit of which one end is connected to the other end of said second diode; a capacitor of which one end is connected to the output connecting point between the output end of said constant current circuit and the other end of said variable reactance circuit and the other end of said capacitor is grounded; and a filter circuit coupled to said output connecting point for low-pass filtering the input signal to generate the filtered output as the output of said envelope generator circuit.

7. A burst signal generating apparatus, as claimed in claim 6, wherein said variable reactance circuit comprises first and second resistors each having one end connected to the other end of said second diode; a third resistor of which one end is connected to the other end of said second resistor and the other is grounded; and a field-effect transistor of which the source is connected to the other end of said first resistor, the gate is connected to the connecting point between said second and third resistors and the drain is connected to said output connecting point.

8. A burst signal generating apparatus, as claimed in claim 1, wherein said modulator circuit includes a frequency modulator circuit.

9. A burst signal generating method comprising the following steps of:
   smoothening the leading and trailing edges of a burst control signal;
   modulating a carrier wave of an intermediate frequency with a modulated signal;
   switching on and off the modulated carrier wave of said intermediate frequency in response to said burst control signal;
   converting the modulated carrier of said intermediate frequency which has been switched on and off into a carrier wave of a radio frequency;
   amplitude-controlling the carrier wave of said radio frequency in response to a smoothened burst control signal by detecting the power amplified output, comparing said burst control signal and the detected output to generate an error signal, and amplitude-controlling said carrier wave of the radio frequency in accordance with said error signal; and
   power amplifying the amplitude-controlled output with a prebiassed high-power amplifier.

10. A burst signal generating method, as claimed in claim 9, wherein said smoothening step comprises the following steps of: integrating said burst control signal in one direction; generating pulses having a prescribed width after the trailing edge of said burst control signal; differentiating said pulses; and discharging with a prescribed time constant the charge integrated in one direction in response to the differentiated pulse voltage.

11. A burst signal generating method, as claimed in claim 10, wherein the modulating step is frequency modulation.

12. A burst signal generating method, as claimed in claim 9, wherein said smoothening step comprises the following steps of: responsive to said burst control signal, charging a capacitor at a constant amperage; discharging it with a prescribed time constant; and low-pass filtering the charged or discharged voltage of said capacitor.

13. A burst signal generating method, as claimed in claim 12, wherein the modulating steps is frequency modulation.

14. A burst signal generating method, as claimed in claim 9, wherein the modulating step is frequency modulation.

* * * * *

UNITED STATES PATENT AND TRADEMARK OFFICE
CERTIFICATE OF CORRECTION

PATENT NO. : 4,706,262

DATED : November 10, 1987

INVENTOR(S) : Ohta

It is certified that error appears in the above-identified patent and that said Letters Patent is hereby corrected as shown below:

COLUMN 7, LINE 51  Delete "the filtered output as the output of said envelope generator circuit"

Signed and Sealed this

Nineteenth Day of July, 1988

Attest:

DONALD J. QUIGG

*Attesting Officer*      *Commissioner of Patents and Trademarks*